United States Patent [19]

Jaccodine et al.

[11] 4,353,086
[45] Oct. 5, 1982

[54] SILICON INTEGRATED CIRCUITS

[75] Inventors: Ralph J. Jaccodine, Allentown, Pa.; John A. Michejda, Clinton, N.J.

[73] Assignee: Bell Telephone Laboratories, Incorporated, Murray Hill, N.J.

[21] Appl. No.: 147,466

[22] Filed: May 7, 1980

[51] Int. Cl.³ .............................................. H01L 27/02
[52] U.S. Cl. ........................................ 357/51; 357/49; 357/59; 357/41; 357/55; 357/50; 357/56
[58] Field of Search ..................... 357/51, 55, 59, 23, 357/41, 50, 56, 49

[56] References Cited

U.S. PATENT DOCUMENTS

| | | | |
|---|---|---|---|
| 3,894,893 | 7/1975 | Kabaya | 148/175 |
| 4,131,910 | 12/1978 | Hartman | 357/49 |
| 4,140,558 | 2/1979 | Murphy | 148/175 |
| 4,184,085 | 1/1980 | Takahashi | 307/238 |
| 4,199,772 | 4/1980 | Natori | 357/23 |
| 4,222,062 | 9/1980 | Trotter | 357/45 |
| 4,260,436 | 4/1981 | Taylor | 148/174 |
| 4,272,776 | 1/1981 | Weijland | 357/50 |

OTHER PUBLICATIONS

Chatterjee et al., *IEEE Trans. Electron Devices*, vol. ED-26, No. 6, Jun. 1979 pp. 827 et seq.
*Philips Res. Reports*, vol. 25, 1970 pp. 118 et seq.
*IEEE Trans. Electron Devices*, vol. ED-26, No. 4, Apr. 1979 pp. 38 et seq.

*Primary Examiner*—Martin H. Edlow
*Attorney, Agent, or Firm*—Arthur J. Torsiglieri

[57] ABSTRACT

A dynamic random access memory in which individual cells, including an access transistor and a storage capacitor, are formed in mesas formed on a silicon chip. The access transistor of the cell is formed on the top surface of the mesa and one plate of the storage capacitor of the cell is formed by the sidewall of the mesa and the other plate by doped polycrystalline silicon which fills the grooves surrounding the mesas isolated therefrom by a silicon dioxide layer. By this geometry, large storage surfaces, and so large capacitances, can be obtained for the capacitor without using surface area of the chip. In other embodiments, the mesas may include other forms of circuit elements.

6 Claims, 14 Drawing Figures

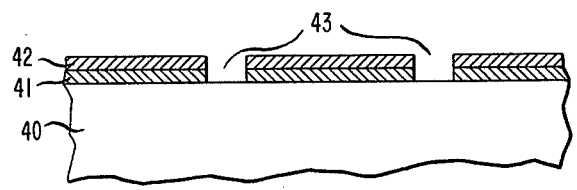
FIG. 4
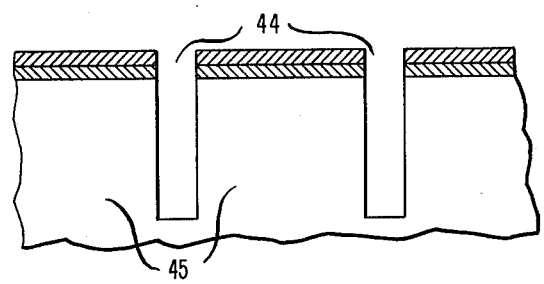
FIG. 5
FIG. 6
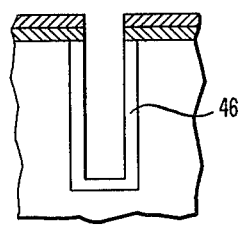
FIG. 7
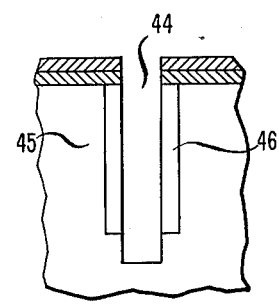
FIG. 8
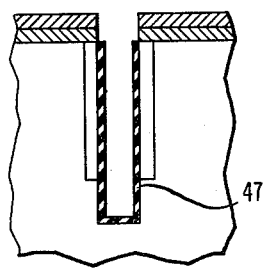
FIG. 9
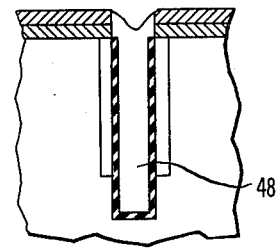

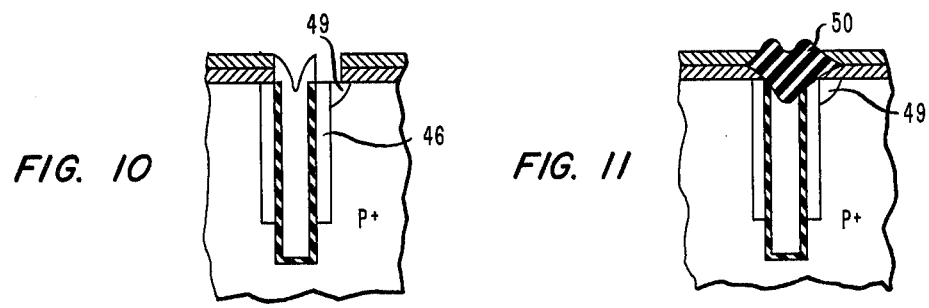
FIG. 10
FIG. 11
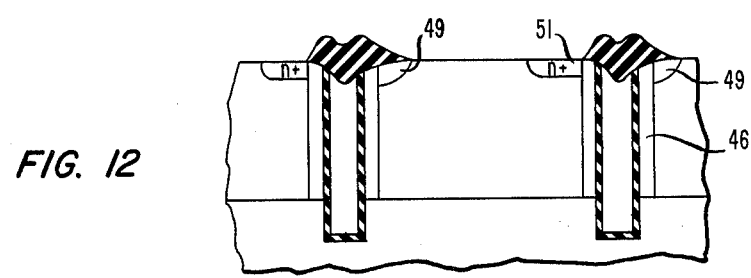
FIG. 12
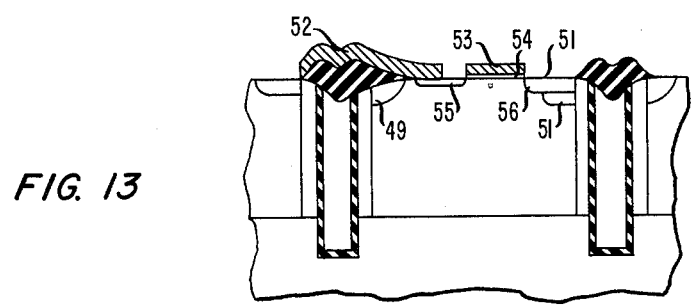
FIG. 13
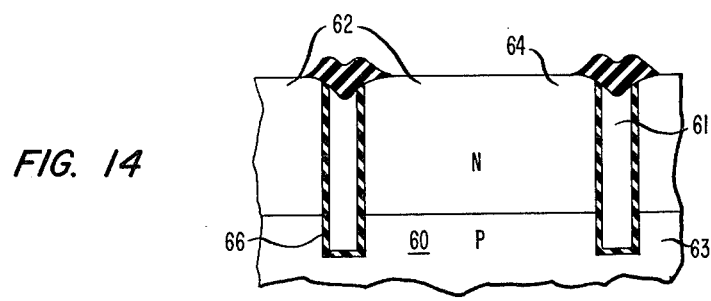
FIG. 14

SILICON INTEGRATED CIRCUITS

BACKGROUND OF THE INVENTION

This invention relates to silicon devices and more particularly to silicon integrated circuits. Typical of such circuits are dynamic random access memories of the kind which utilize an array of memory cells, each of which includes an access or gating transistor for controlling the charging and discharging of a series-connected storage capacitor.

It will be convenient to describe the invention with particular reference to such a dynamic RAM, although the invention in its broader aspects is not limited to such devices.

In memory technology, the emphasis is on increasing the number of memory cells that can be included on a single chip. To this end, it is important to minimize the surface area required of a memory cell since the surface area available on the chip for the memory array currently is a limiting factor in the total number of cells that can be included in one chip. Presently the preferred cell from the standpoint of minimum area is the one-transistor, one-capacitor cell. In such a cell, the capacitor normally has been a surface device and its capacitance is determined by the amount of surface area it is permitted to occupy. A characteristic of dynamic RAMs of this type is that the amount of signal charge that can be stored and later read out is a function of the capacitance of the storage capacitor, and accordingly the larger the capacitance the more easily is the signal detected. Additionally, for a high signal-to-noise ratio it is also important that the storage capacitance be large compared to the parasitic capacitance of the sense lines. For these reasons, it is generally advantageous to have as large a storage capacitance as size considerations permit.

To increase the storage capacitance, there have been proposed in the past memory cells in which the storage capacitor is buried under an access transistor of the V-MOS type to facilitate interconnection, but these cells have proven difficult to fabricate reliably in the densities needed to be competitive with available technology.

SUMMARY OF THE INVENTION

To achieve a storage capacitor of large storage surface area at little cost to the surface area of the chip, the invention uses a memory cell in which the storage capacitor extends vertically from the surface rather than parallel to its surface. To facilitate fabrication and interconnection, individual cells are formed in individual mesas.

In the present invention, the memory is formed in a monocrystalline silicon chip which is grooved to form a plurality of mesas arranged in rows and columns, and an individual memory cell is located within an individual mesa. In the preferred embodiment, the grooves are filled with doped polycrystalline silicon. The access transistor of a cell is formed on top of the mesa. One plate of the storage capacitor is formed by the sidewall of the mesa and the other plate is formed by the conductive polycrystalline fill. An insulating layer on the wall of the mesa serves as the capacitor dielectric.

In such a cell, the surface area required is essentially that of the access transistor and is largely independent of the storage capacitor, and the capacitance of the storage capacitor can be increased as desired simply by increasing the height of the mesa (or the depth of the grooves) with little effect on the chip surface area required. Moreover the parasitic capacitance of the sense lines can be kept low by running the lines over the grooves.

In a preferred embodiment, the bulk of the chip is p-type and in each cell the access transistor is an n-channel MOS transistor. The drain/source of the transistor is connected to an n-type layer formed on the sidewall of the mesa which serves as one plate of the storage capacitor, and the source/drain of the transistor is connected to a sense line conductor which overlies the polycrystalline fill of an adjacent groove and is insulated therefrom by an oxide layer. As is well known in cells of this kind, in the reading and writing operations the roles of source and drain are exchanged by an individual transistor connection.

It is to be understood throughout this specification that whether a region is a source or a drain at a particular time depends on the conductivity type of the regions, the polarity of the applied potential, and whether the storage capacitor is being charged or discharged.

However, in a broader aspect, the invention comprises an integrted circuit device which is formed in a single chip which includes a monocrystalline silicon substrate on which are supported a plurality of monocrystalline silicon mesas, each surrounded by a groove or moat which is filled with polycrystalline silicon sufficient to maintain substantive planarity of the top surface, the polycrystalline silicon being electrically isolated from the monocrystalline silicon either by a silicon oxide layer or by being undoped to be of high resistivity. Advantageously, the polycrystalline silicon is doped to be conductive so that it can be utilized as a region of reference potential. In this broad aspect, the individual mesas may include any of the known form of circuit elements.

BRIEF DESCRIPTION OF THE DRAWING

FIGS. 4 through 13 show various stages in an illustrative process for fabricating a memory cell array of the kind shown in FIG. 2; and FIG. 14 is a schematic cross-sectional view of a portion of a chip useful for incorporating a plurality of bipolar circuits in accordance with another embodiment of the invention.

Figure 1:
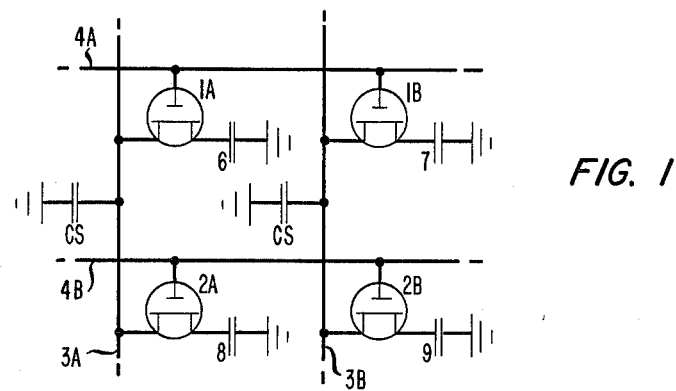
FIG. 1 is a schematic circuit of a conventional two-by-two array of memory cells useful in the description of the invention.

It will not be convenient for the drawing to be to scale because of the small dimensions involved of some of the elements.

DETAILED DESCRIPTION

In FIG. 1 there is shown schematically a memory of the kind to which the invention is applicable. It comprises simply a two-dimensional matrix of four cells of which 1A and 1B form the two access transistors of one row, 2A and 2B the transistors of another, and 1A and 2A form one column and 1B and 2B form the other. Although the roles will reverse during operating, it will be convenient to refer to the transistor electrodes connected to the bit lines as the sources. Accordingly, the sources of 1A and 2A are connected to a common bit or sense line 3A, and the sources of 1B and 2B to a common bit or sense line 3B. The gates of 1A and 1B are coupled to a common word line 4A, and the gates of 2A and 2B to a common word line 4B. Serially connected between the drains of the access transistors, 1A, 1B, 2A and 2B and a point of reference potential, shown as ground, are the storage capacitors, 5, 6, 7, and 8, respectively. A parasitic capacitance $C_S$ is shown associated with each bit line. Normally the memory would include a much larger number of cells.

Advantageously, in a memory of this kind, for a large signal it is important to have a large value of storage capacitance. For a good signal-to-noise ratio it is important that the storage capacitance by large compared to the parasitic capacitance $C_S$. The operation of a memory of this kind is well known.

Figure 2:
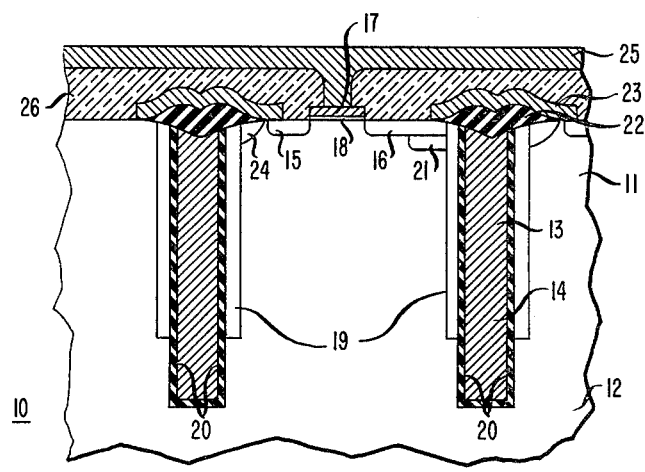
FIG. 2 is a schematic cross-sectional view of a portion of memory cell array in accordance with one embodiment of the invention.
Figure 3:
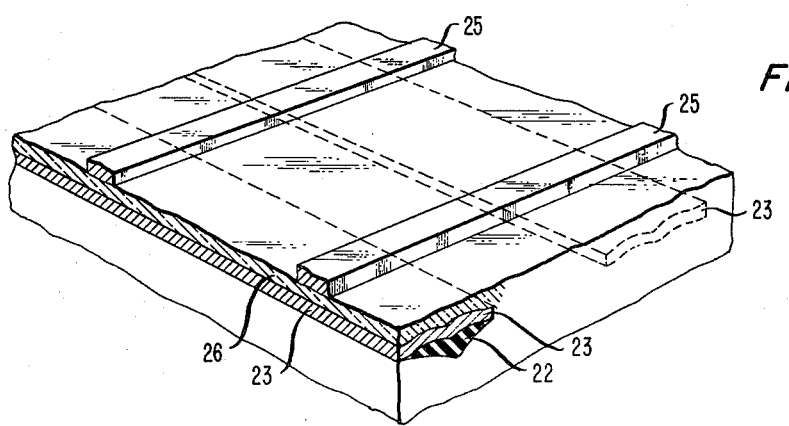
FIG. 3 is a perspective top view of the embodiment of FIG. 2.

FIGS. 2 and 3 show a portion of the memory cell array 10 at a stage almost ready for packaging. It comprises a monocrystalline silicon chip whose top surface is grooved to provide a two-dimensional array in rows and columns of individual mesas 11, typically rectangular in cross-section, sharing a common support portion 12.

It is to be understood that as used herein the term "silicon chip" includes both a thick monocrystalline silicon wafer which is self-supporting, and an epitaxial silicon layer grown either on a suitable conductive base which may be silicon or on a suitable insulating base which may be sapphire.

Each mesa houses an individual cell comprising its own access N-MOS transistor and storage capacitor. The individual mesas are separated by the grooves 13 which are filled with conductive polycrystalline silicon 14 to maintain an essentially planar top surface to facilitate the desired interconnection of the cells by patterned metallization of the top surface. Each access transistor comprises a source and a drain formed by spaced localized n-type surface regions 15 and 16, respectively, and a gate electrode 17 spaced from the silicon surface by the gate insulator 18, typically of silicon dioxide. Each storage capacitor comprises one plate formed by an n-type diffused layer 19 which preferbly extends in a closed path completely around the sidewall of the groove and the other plate formed by the polycrystalline silicon filling 14 of its surrounding groove. The p-n junction formed between the surface layer and the bulk of the mesa isolates the layer from the bulk. In some instances it may prove desirable to maintain the bulk at a fixed negative potential. A dielectric layer 20, typically of silicon dioxide, which coats the groove and provides d-c isolation between the filling 14 and the monocrystalline silicon of the mesa, serves as the capacitor dielectric. As best seen in FIG. 3, the various polycrystalline silicon fillings are all interconnected and these are maintained at a common reference potential, typically ground. This ground connection advantageously is made outside of the memory area at the periphery of the chip and need not be made to individual fillings. To ensure isolation between the storage capacitors, the n-type layers 19 do not extend the full depth of the grooves so that each is limited to a single mesa. Advantageously in each mesa, a highly doped n-type region 21 is included to provide a low resistance connection between the drain region 16 and the storage electrode plate region 19. Additionally, a chanstop 24, which is a more heavily doped p-type zone is included at the source end of the mesa.

Each filled groove includes thereover a relatively thick dielectric layer 22, typically of silicon dioxide. Over these layers run the bit lines 23 which make low resistance connection to the source region 15, and which run the length of the array, normal to the plane of FIG. 2 as seen in FIG. 3 interconecting all the sources of the access transistors in a common column. This bit line advantgeously is polycrystalline silicon treated to be highly conductive. This treatment comprises high doping, and optionally also overlaying a metal layer, as for example, of tantalum or titanium, and sintering to form a silicide.

Also overlaying the top surface of the chip will be the word lines 25 running parallel to the plane of the paper in FIG. 2 as seen in FIG. 3. These word lines typically comprise an aluminum layer and cross over the bit lines, electrically isolated therefrom by a dielectric layer 26, typically phosphosilicate glass, which is appropriately apertured to permit an individual word line to make connection to the gate electrode of each of the access transistors in a common row, as is well known in the art.

With a memory cell of the kind described, the size of the storage capacitance will be dependent on the properties of the capacitor dielectric and the surface area of the capacitor plates. These can be adjusted to provide the desired value of capacitance with little effect on the area of the top surface of the chip. Moreover, because the bit line which is used as the sense line runs over the insulating layer on the top of the grooves, its parasitic capacitance may be kept low, which is desirable for a high signal-to-noise ratio.

This design also permits a large value of storage capacitance because of the relatively large area of the capacitor, which area is the product of the circumference of the mesa and the height of the n-type layers 19. This distance can be readily increased if desired without increasing the surface area required of an individual cell by increasing the depth of the grooves.

For forming an array of memory cells of the kind shown in FIGS. 1 and 2, illustratively there is first prepared a slice of monocrystalline silicon in which many chips, each housing the desired array of memory cells, are to be formed simultaneously. The slice may be either uniformly of relatively high p-type resistivity or else have a support portion of relatively low resistivity on which has been grown an epitaxial layer of relatively high resistivity within which the access transistor is to be formed. In either case the slice is provided with a surface portion at least several microns thick in which the predominant significant impurity has a concentration of between $1-5 \times 10^{15}$ acceptor atoms per cubic centimeter. There is then formed over this surface portion a layer of silicon dixide illustratively about 300 Angstroms thick. This is best done by heating the slice, after suitable cleaning, in an oxidizing atmosphere in known fashion. This oxide layer is then covered in turn with a silicon nitride layer of about 1200 Angstroms thick. Techniques for the deposition of a suitable layer are well known. The dual $SiO_2$-$Si_3N_4$ layer is intended to serve, after patterning, as a mask for forming the desired grooves in the various silicon chips to be formed from the slice.

Techniques for patterning such a dual layer are well known. Typically, a photoresist is deposited over the layer and photolithographic techniques are used to form a desired pattern in the photoresist. Selective etchants are thereafter used to remove in turn the silicon nitride and the silicon dioxide to arrive at the stage depicted in FIG. 4. At this point the silicon slice 40 has its top surface covered with a layer 41 of silicon dioxide and a layer 42 of silicon nitride, which are patterned in two dimensions to provide openings down to the silicon surface. The pattern is such as to leave masked regions forming a two-dimensional array corresponding to that desired for the cell array.

The masked silicon slice is then treated to form grooves 44, as seen in FIG. 5, in the region where the bare silicon has been exposed, leaving a two-dimensional array of mesas 45. To conserve space it is advantageous that the grooves be narrow with essentially straight vertical walls, although in some instances some slight taper may be desirable to facilitate further processing, such as the doping of the sidewalls of the mesa and the filling of the grooves. Reactive ion anisotropic etching is presently a known technique for forming grooves of the kind desired. For a typical design using two micron design rules, the grooves may be about three microns deep and two microns wide, and the mesas formed may be rectangular in cross section, about seventeen microns by seven microns. The longer dimension would accommodate the length of the access transistor being shown in the plane of the drawing. The sidewalls of the mesas are then doped to form the heavily doped n-type regions which serve as one plate of the storage capacitor in each mesa. Advantageously this is done by first implanting arsenic ions on the vertical side walls of the grooves and then heating to diffuse the arsenic ions deeper into the mesas away from the sidewalls. Alternatively, solid state-vapor diffusion alone may be used. In either case, the dual $SiO_2$-$Si_3N_4$ layer may continue to serve as the mask for localizing the introduction of the donor atoms to the walls of the grooves. In a typical design, there are formed layers about several tenths of a micron thick with an average doping of about $10^{19}$ arsenic atoms per cubic centimeter. In FIG. 6 there is shown the resultant with n-type layers 46 coating the walls of the grooves.

The slice is then subjected to a treatment that will eliminate that portion of the layer 46 that covers the bottoms of the grooves and thereby confine each layer 46 to a single mesa. This most conveniently is done by deepening the grooves another micron or two without disturbing significantly the doped layers on the sidewalls. Reactive ion anisotropic etching again can be used to this end. FIG. 7 shows the grooves deepened below the n-type layers 46.

Then as seen in FIG. 8, there is formed a dielectric layer 47 over the walls of the groove to serve as the storage capacitor dielectric. This may be done conveniently by heating the slice in an oxidizing atmospheric fashion for a time and at a temperature sufficient to form an oxide layer of about 500 Angstroms on the exposed walls of the mesas.

Next, as seen in FIG. 9, the grooves are filled with polycrystalline silcon 48 to a level to restore essentially the planarity of the top surface of the slice. Various techniques are available for this purpose, particularly since the semiconductive properties of the silicon are not important. Known chemical vapor deposition techniques should be particularly advantageous. For use as a capacitor plate, it is desirable that this silicon be conductive so that it should be appropriately doped. This can readily be done by including an appropriate impurity in the vapor. Moreover, other conductors would be suitable for this fill although the silicon is preferred to minimize thermal mismatch problems that might strain the monocrystalline silicon mesas undesirably.

It can be appreciated that the fillings will all be interconnected so that they can all be maintained at a uniform potential simply by connections at the edges of the chip.

It then usually will be necessary to remove any polycrystalline silicon that has deposited over the silicon nitride on the top of the mesas. A wet etchant suitable for silicon, such as potassium hydroxide, should be adequate for this purpose. Some etching of the polycrystalline filling is tolerable, as depicted in FIG. 9.

It will usually be desirable to include a channel stop to minimize inadvertent inversion of the surface layer of the chip underlying the region of the bit line conductor before it connects to the source region of the transistor. To this end, it is desirable to form a boron-rich p+type region localized at the edge of the top surface of the mesa opposite the edge where the transistor drain is connected to the n+diffused layer forming one of the capacitor plates.

Advantageously, this is done by masking the surface to expose only one edge of the top surface of the mesa, and etching away the exposed portion of the silicon nitride-silicon dioxide dual layer, thereby to bare this edge of the top surface of the mesa, as is seen in FIG. 10.

Boron ions are then implanted selectively into this bared edge portion to form a p-type localized surface zone 49 as seen in FIG. 10. The doping in this region advantageously is lower than the doping in layer 46 and typically about $3 \times 10^{16}$.

The slice is then subjected to another oxidizing treatment to form a relatively thick dielectric layer over the chanstop regions and over the top of the polycrystalline filled grooves over which are to be deposited the bit or sense lines. This layer serves to electrically isolate these lines from the underlying polycrystalline silicon fill which is all to be maintained at the constant reference potential, such as ground. Typically, heating in an oxidizing atmosphere can be used to convert the polycrystalline silicon at the top of the grooves and the exposed chanstop region of the monocrystalline silcon to silicon dioxide to form the dielectric layer 50, typically between one and two microns thick, shown in FIG. 11.

Then there is preferably removed in turn, in known fashion, the remainder of the silicon nitride layer 42 and the silicon dioxide layer 41 overlying the top of the mesa.

It is then advantageous to form at the top surface of each mesa a heavily doped n-type localized zone which will be useful in facilitating low resistance connection between the drain of the access transistor and the mesa wall layer which serves as one plate of the storge capacitor.

To this end, as seen in FIG. 12, there is then formed in each mesa at one edge a heavily doped localized n-type portion 51 which overlaps the n-type wall layer 46 and will help interconnect the drain of the access transistor to this layer. Typically, these portions are formed by the known combination of silicon oxide masking and vapor-solid diffusion techniques.

The mesa surface is now stripped clean and the surface prepared for the formation of the access transistor therein in conventional fashion.

Accordingly, after such surface preparation, the transistor gate oxide is groven over the mesa, typically about 500 Angstroms thick. This is followed by the deposition of a polycrystalline silicon layer over the surface of the chip which is patterned to provide both a plurality of bit lines, each of which overlies a grooved region and runs normal to the plane of the drawing, and a plurality of discrete gate electrode portions, one for each mesa, localized over the surface region which is to serve as the channel of the corresponding access transistor.

In FIG. 13, there is shown the bit lines 52, the gate electrodes 53, and the gate oxide 54.

Then with the polysilicon gate electrode 53 and the polysilicon bit line 52 serving as masks, the surface of the slice is subjected to ion implantation and diffusion drive-in, in known fashion, to form in each mesa the n-type source and drain zones of the access transistor. As seen in FIG. 13, the various elements are positioned such that the implanted source region 55 extends to connect to the bit line 52 and the implanted drain region 56 overlaps the previously formed zone 51. Typically, the lengths of the source, channel and drain are each between one and two microns.

Then as seen in FIGS. 2 and 3, the slice is then coated with a phosphosilicate glass. There remains the need to provide the plurality of word lines, and to this end contact windows are opened selectively in the glass at regions overlying the gate electrodes. Techniques are well known for this purpose and typically involve photolithography for masking the glass except where the opeings are to be made and reactive ion etching for opening holes at unmasked portions of the glass.

This is followedc by deposition of a metal layer over the chip suitable for providing the word lines. This layer is then appropriately patterned in known fashion to provide the plurality of word lines, each word line making low resistance connection selectively to the gate electrodes of all the access transistors in a common row as is usual. Typically, the metal layer may be of aluminum and there is included a sintering step to better fuse the aluminum layer to the polycrystalline silicon forming the gate electrode. The resultant is shown in FIG. 2 in which the glass layer 26 is shown apertured to permit the word line conductor 25 to contact the gate electrodes 17.

It is to be appreciated that typically each memory chip includes, in addition to the array of memory cells, various auxiliary circuits for writing into and reading out of individual cells and such circuits would be fabricated in the chip. Additionally, in high capacity memories, it might prove desirable to provide redundancy to permit the electrical substitution of unsatisfactory cells with satisfactory cells. Provision would normally be made for such additional circuitry in usual fashion.

Moreover, in usual fashion, after the slice processing has been completed, the slice would be cut up in individual chips for testing and packaging in the usual fashion.

It is to be appreciated that considerable variation from the specific process described is feasible in making a memory cell in accordance with the invention.

It should also be appreciated that the specific embodiment described is merely illustrative of the general principles of the invention. If it were desired to use P-channel access transistors, it would be necessary to reverse the conductivity-types of the various regions where the type is important. Moreover, it may be feasible to provide a topology for individual cells that would permit sharing of connections, for example, the sources of a pair of transistors in adjacent rows may be made to share a common bit line connection.

It should also be evident that other types of access transistors, such as bipolar forms, could be employed, if this were found desirable, after appropriate change in the interconnections. It will be advantageous that such access transistors include a pair of terminals which may be termed the conduction terminals corresponding functionally most nearly to the source and drain and a control terminal corresponding to the gate.

Additionally, it should be recognized that the basic principles of the embodiment described might find utility in any circuit where there is desired, in a single chip, a large array of capacitors without sacrificing large amounts of chip surface area. Such circuits might include other forms of memories or other forms of signal processing circuits.

Additionally, in a broader aspect the invention provides an alternative to the partially dielectrically isolated silicon integrted circuits now known in the art in which a monocrystalline silicon chip is grooved to form a plurality of mesas and the grooves are thereafter filled with silicon dioxide to establish planarity. Technology of this kind has variously been described as ISOPLANAR and OXIL technology. With such devices, it has sometimes proven difficult to refill the grooves with oxide without affecting deleteriously the electrical properties of the monocrystalline mesas because of the difference in thermal mismatch between the silicon and the silicon dioxide. To mitigate the mismatch problem, in accordance with the broader aspect of the invention, nonconductive polycrystalline silicon is used to fill the grooves either partially or completely.

FIG. 14 shows an integrated circuit chip useful in this way. It includes a silicon chip 60 which is provided with a plurality of grooves 61 to define a plurality of mesas 62. The chip includes a bulk portion 63 of p-type conductivity and a surface portion 64 of n-type conductivity. The grooves typically extend beyond portion 64 into the bulk 63 whereby the portion 64 of each mesa is effectively electrically isolated from similar portions 64 of all other mesas, particularly if a reverse bias is maintained on the p-n junctions between the portions 64 and the bulk 63. Since each mesa is isolated, each can support its own circuit elements, which may be any of the known forms, including either bipolar or MOS transistors.

Moreover, the grooves 61 ordinarily will be filled with doped polycrystalline silicon as in the prior embodiment, in which case it will normally be advantageous to provide a layer of silicon dioxide in the grooves, as before, to isolate the fill from the individual mesas. In this case the fill can be maintained at some reference voltage useful in the circuit.

Alternatively, the fill can be of undoped polycrystalline silicon to be of high resistivity. In this case, if the resistivity is sufficiently high, there may be eliminated the need for the silicon dioxide layer in the grooves to provide electrical isolation. In this case, there may be doped selectively localized regions of the fill to serve as localized resistors for use in combination with circuit elements in the mesas. Alternatively thin conductive films may be deposited over the fill to serve as resistors.

Similarly, undoped polycrystalline silicon may be used to provide isolation between the two different types of transistors in circuits using complementary pairs of transistors.

Moreover, in some instances after the polycrystalline silicon is used to fill the grooves between mesas, there results a corrugated top surface which cannot readily be made planar by simple etching. In such instances, it may prove useful to deposit over the polysilicon a sacrificial layer of a material which can be etched substantially at the same rate as the polysilicon by some convenient etching technique. The sacrificial layer is deposited to a thickness to provide a composite layer of polysilicon and the material which has a substantially planar layer, and then subjected to the etching treatment to reduce uniformly the thickness of the dual layer until there results substantially a planar surface only of the polysilicon.

We claim:

1. A memory comprising a plurality of memory cells arranged in an array of rows and columns, each memory cell including an access transistor and a storage capacitor serially connected, comprising a monocrystalline silicon chip which is grooved to form a plurality of individual mesas (11) arranged in columns and rows characterized in that polycrystalline doped silicon (14) fills the grooves (13) and is isolated from the mesas by a dielectric layer (20), a separate access transistor is formed on the surface of each mesa, and a separate storage capacitor is associated with each mesa, one plate of the capacitor being formed by a layer (19) on the sidewall of the mesa and the other plate by the polycrystalline silicon fill (14), and the sidewall layer including a low resistance connection to a source/drain region of the surface access transistor.

2. A memory in accordance with claim 1 in which the layer on the sidewall of the mesa is a layer of conductivity type opposite that of the bulk of the mesa for forming a rectifying junction isolating the layer from the bulk.

3. A memory in accordance with claim 1 in which in each mesa the layer makes low resistance connection to a terminal (16) of the access transistor of the mesa.

4. A memory in accordance with claim 3 in which another terminal (15) of the transistor makes low resistance connection to a bit line conductor (23) which extends along the chip overlying a groove and is electrically insulated from the underlying polycrystalline silcon.

5. A semiconductive device comprising a monocrystalline silicon chip which is grooved to form a plurality of mesas (11) whose bulk (12) is of one conductivity type and whose top surface includes at least one semiconductive circuit component characterized in that the walls of the mesa are coated with a dielectric layer (18) and the grooves are filled with conductive silicon material (14), the walls of the mesa include a layer (19) of conductivity type opposite that of the bulk of the mesa, connections (16, 21 and 15) are provided to the separate layers of opposite conductivity type and to the conductive filling material whereby a plurality of capacitors are formed, each between a connection to the layer and a connection to the fill, for interconnection with the semiconductive circuit components on the top surface of the mesas.

6. A random access memory made up of an array of meory cells arranged in rows and columns and interconnected by word and bit lines, each memory cell comprising an access transistor and a storage capacitor serially connected characterized in that each memory cell is essentially formed in an individual semiconductive mesa, the individual mesas sharing a common semiconductive support, each mesa is surrounded in turn by a dielectric layer and conductive material and includes a sidewall layer forming a rectifying junction with the bulk of the mesa, the sidewall layer forming one plate of a storage capacitor, the conductive material forming the other plate of a storage capacitor and the dielectric layer serving as the capacitor dielectric, and each mesa includes at its top surface an access transistor, the access transistor including one terminal which makes low resistance connection to the surface layer in the mesa and another terminal which makes a low resistance conection to a bit line, and the bit lines comprise conductive films extending over the filled grooves and electrically isolated from the fill.

* * * * *